(12) United States Patent
Williams

(10) Patent No.: US 12,426,198 B2
(45) Date of Patent: Sep. 23, 2025

(54) SYSTEMS INCLUDING AIRFLOW DEFLECTORS FOR COOLING INTERNALLY-POSITIONED ELECTRONIC ELEMENTS

(71) Applicant: Lenovo Enterprise Solutions (Singapore) Pte Ltd., Singapore (SG)

(72) Inventor: Paul Williams, Research Triangle Park, NC (US)

(73) Assignee: Lenovo (United States) Inc., Morrisville, NC (US)

( * ) Notice: Subject to any disclaimer, the term of this patent is extended or adjusted under 35 U.S.C. 154(b) by 243 days.

(21) Appl. No.: 18/129,101

(22) Filed: Mar. 31, 2023

(65) Prior Publication Data

US 2024/0334640 A1 Oct. 3, 2024

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01)

(58) Field of Classification Search
CPC .............................. H05K 7/20145; G06F 1/20
USPC ....................................................... 361/695
See application file for complete search history.

(56) References Cited

U.S. PATENT DOCUMENTS

| | | | |
|---|---|---|---|
| 7,345,873 B2* | 3/2008 | Dey | G06F 1/20 361/691 |
| 2007/0091566 A1* | 4/2007 | Sun | G06F 1/20 361/695 |
| 2011/0184568 A1* | 7/2011 | Tai | G05D 23/1934 700/282 |
| 2015/0029659 A1* | 1/2015 | Shao | G06F 1/20 361/695 |
| 2017/0286346 A1* | 10/2017 | Aldridge | G06F 13/4068 |

* cited by examiner

*Primary Examiner* — Zhengfu J Feng
(74) *Attorney, Agent, or Firm* — Olive Law Group, PLLC

(57) ABSTRACT

Systems including airflow deflectors for cooling internally-positioned electronic elements are disclosed. According to an aspect, a system comprises an electronic device including an electronic element that generates heat during operation. The electronic element is positioned within an internal space of the computing device. The system also includes an airflow deflector attached to the computing device and positioned within the internal space adjacent to the electronic element. The airflow deflector includes a protrusion that extends in a direction substantially towards the electronic element. The protrusion is positioned and shaped for at least partially directing airflow within the internal space towards the electronic element for cooling the electronic element.

16 Claims, 4 Drawing Sheets

SYSTEMS INCLUDING AIRFLOW DEFLECTORS FOR COOLING INTERNALLY-POSITIONED ELECTRONIC ELEMENTS

TECHNICAL FIELD

The presently disclosed subject matter relates generally to electronic devices and systems. Particularly, the presently disclosed subject matter relates to systems including airflow deflectors for cooling internally-positioned electronic elements.

BACKGROUND

Electronic devices, such as servers and desktop computers, have internal components that generate heat during operation. Such generated heat can be harmful to or compromise the functionality of the internal component or other components of the electronic device. The issue of heat generation has become more prevalent with increasing speed and density of internal components. As an example, memory components and processors can generate excessive heat that adversely affect their operation. Excessive heat generated by internal components must be removed in order to ensure reliable performance and a long lifetime of the electronic device.

Various techniques and equipment have been employed for removing or otherwise managing excessive heat. For example, heat sinks have been attached to electronic components, such as dual in-line memory modules (DIMMs) within servers, for improving air cooling. In addition, heat sinks in combination with fluid cooling have been utilized to transfer heat from DIMMs. In another example, cooling fans are used for providing airflow to past heat-generating devices in order to provide cooling. Disadvantages of such techniques and equipment include a lack of internal space, complexity of implementation, and additional power requirements.

In view of the foregoing, there is a continuing need for improved techniques and systems for removing excess heat of internal components of electronic devices.

BRIEF DESCRIPTION OF THE DRAWINGS

Figure 1:
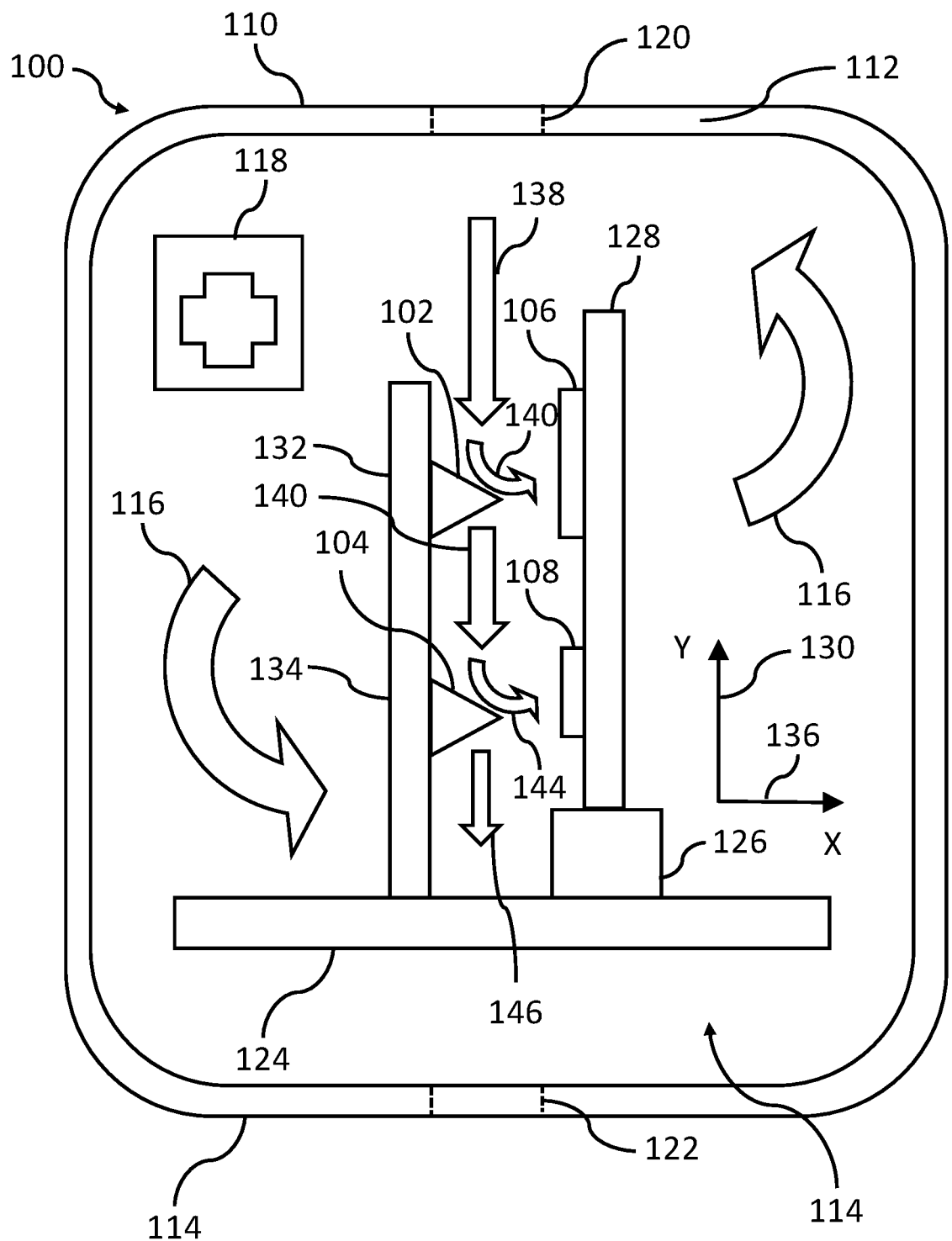
Figure 2:
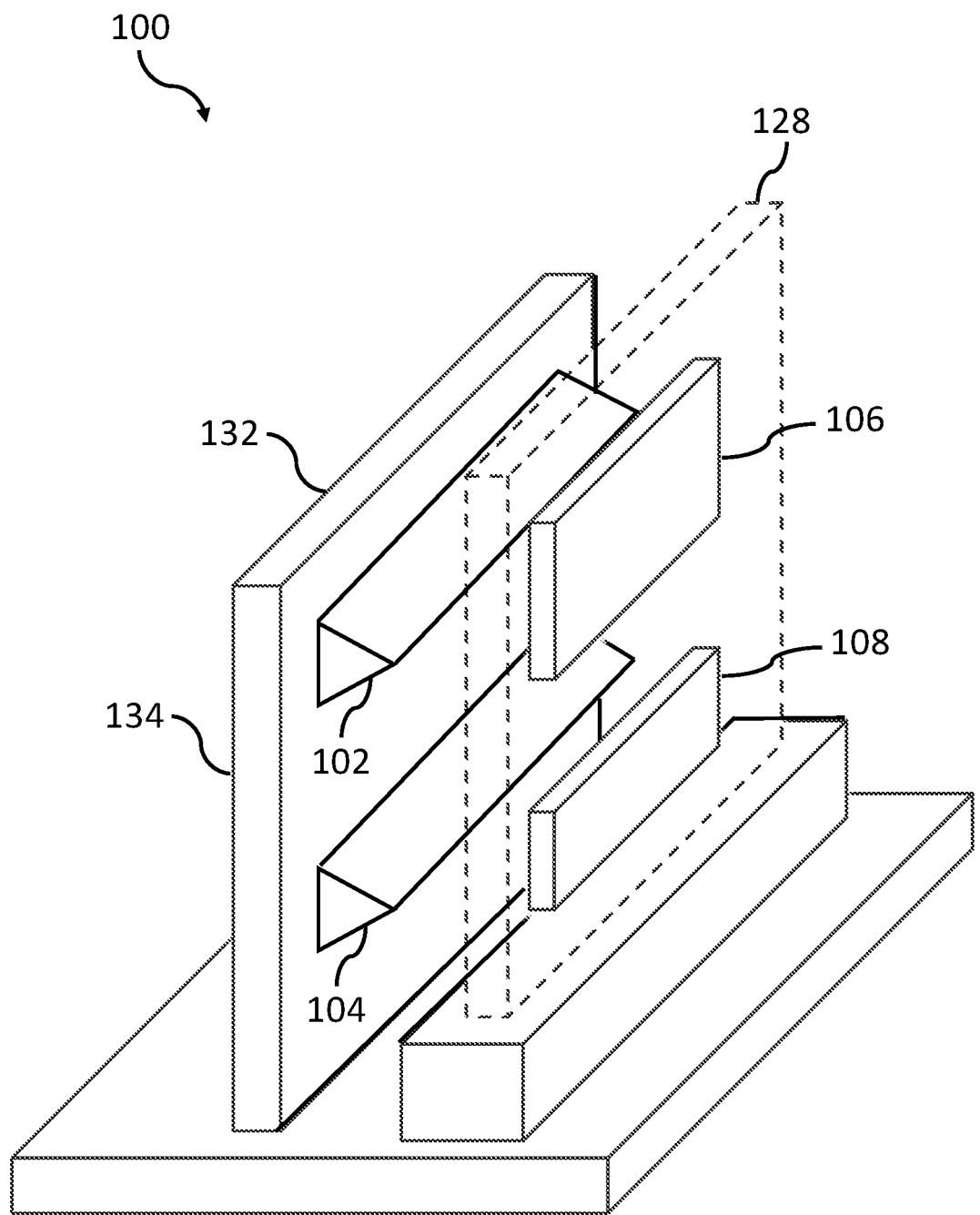
Figure 3:
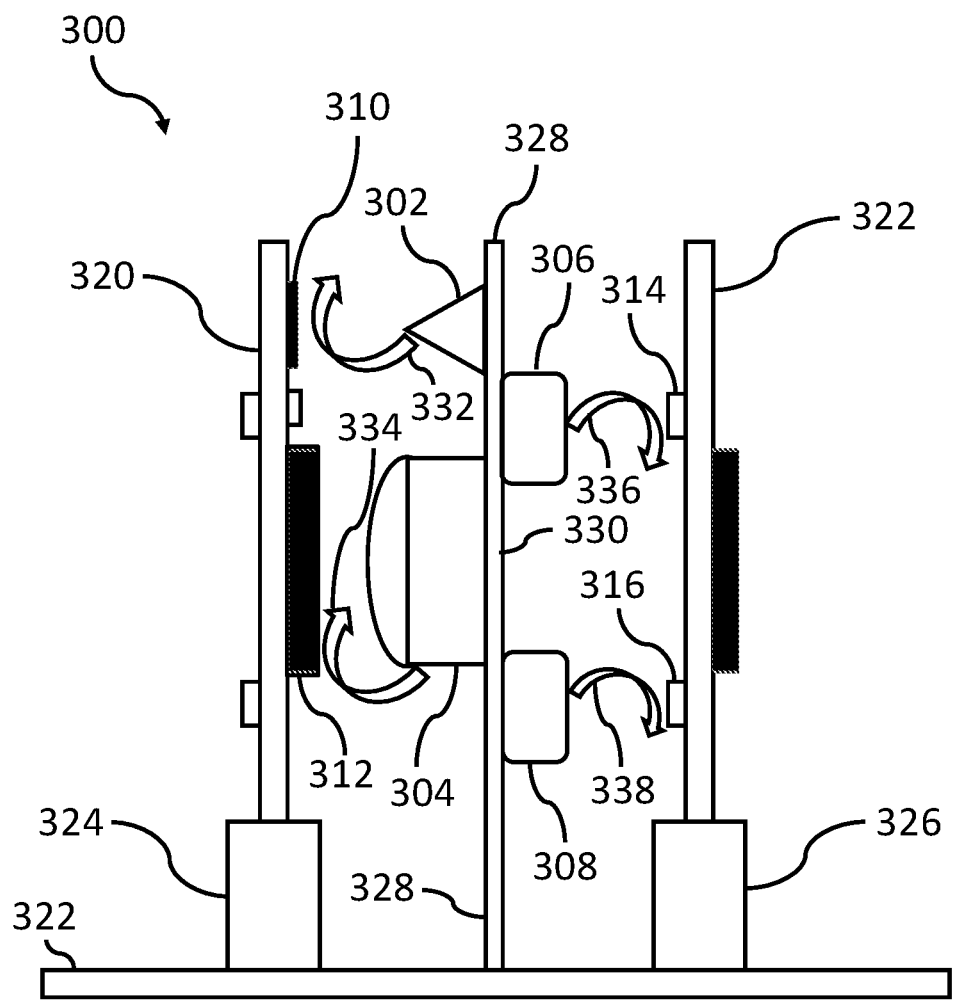
Figure 4:
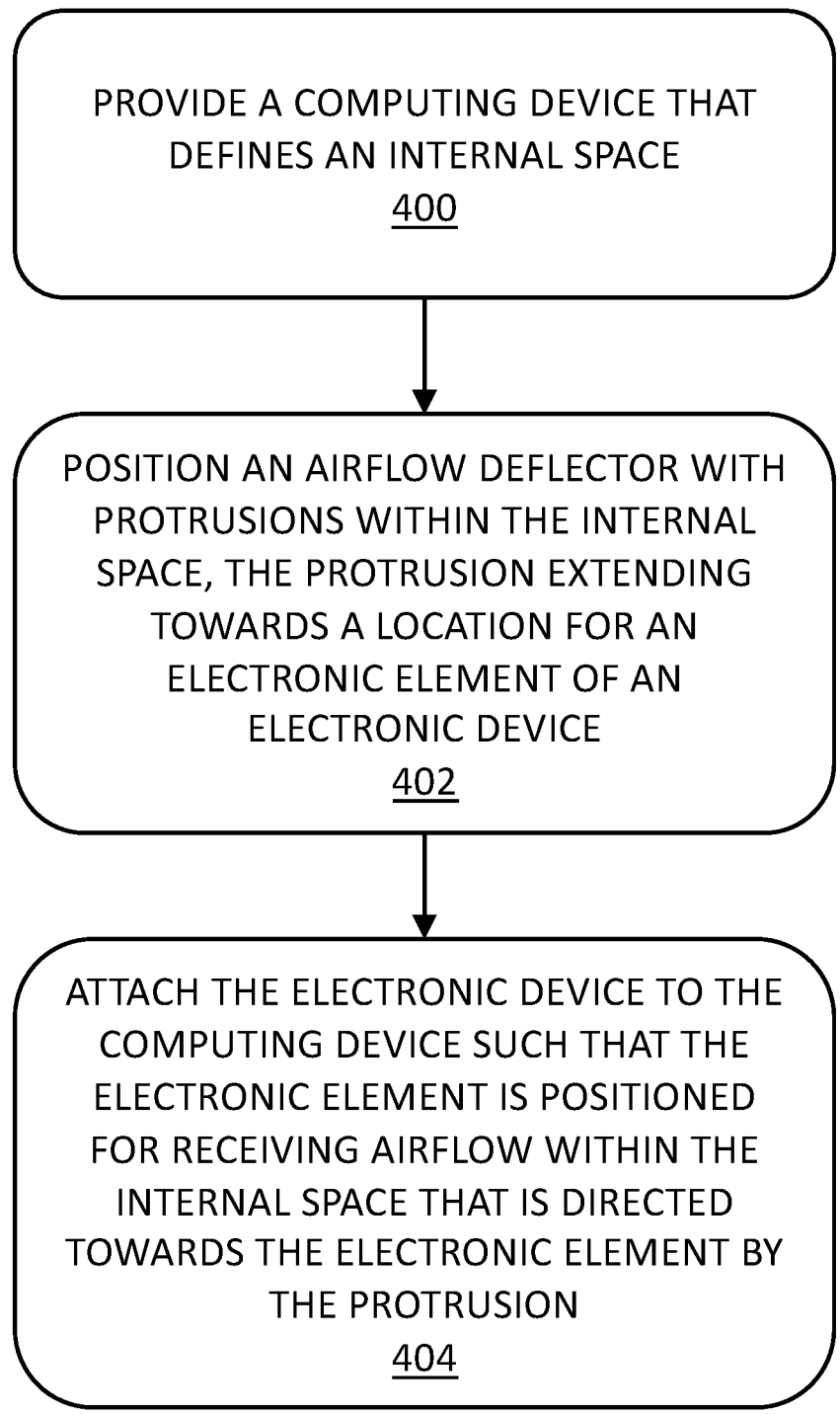

Having thus described the presently disclosed subject matter in general terms, reference will now be made to the accompanying Drawings, which are not necessarily drawn to scale, and wherein:

FIG. 1 is a diagram of a system including airflow deflector protrusions for cooling electronic elements of an electronic device in accordance with embodiments of the present disclosure;

FIG. 2 is a perspective view of the system shown in FIG. 1;

FIG. 3 is a diagram of another system including airflow deflector protrusions for cooling electronic elements of expansion modules in accordance with embodiments of the present disclosure; and FIG. 4 is a flow diagram of an example method for using airflow deflectors for cooling internally-positioned electronic elements in accordance with embodiments of the present disclosure.

SUMMARY

The presently disclosed subject matter relates to systems including airflow deflectors for cooling internally-positioned electronic elements. According to an aspect, a system comprises an electronic device including an electronic element that generates heat during operation. The electronic element is positioned within an internal space of the computing device. The system also includes an airflow deflector attached to the computing device and positioned within the internal space adjacent to the electronic element. The airflow deflector includes a protrusion that extends in a direction substantially towards the electronic element. The protrusion is positioned and shaped for at least partially directing airflow within the internal space towards the electronic element for cooling the electronic element.

According to another aspect, a method includes providing a computing device that defines an internal space. The method also includes positioning an airflow deflector within the internal space of the computing device. The airflow deflector includes a protrusion that extends in a direction substantially towards a location for an electronic element of an electronic device. Further, the method includes attaching the electronic device to the computing device such that the electronic element is positioned for receiving airflow within the internal space that is directed towards the electronic element by a protrusion of an airflow director, wherein the protrusion extends in a direction substantially towards the electronic element.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

FIG. 1 illustrates a diagram of a system 100 including airflow deflector protrusions 102 and 104 for cooling electronic elements 106 and 108, respectively, of computing device 110 in accordance with embodiments of the present disclosure. Referring to FIG. 1, the electronic device may include a housing 112 and/or other structure(s) that defines an interior space, generally designated 114. It is noted that the housing 112 and/or other components may not be depicted in scale with respect to each other. Airflow (indicated by arrows 116 for example) may move in the internal space 114. Airflow may be urged by any suitable method such as, for example, differences in temperature of spaces in the internal space, or operation of an electronic fan 118 within the internal space 114. In another example, airflow may be urged by entry and/or exit of airflow via openings 120 and/or 122 (indicated by broken lines) defined in the housing 112.

In this example, the computing device 110 is a server, but it may alternatively be any other suitable device such as a desktop computer. The computing device 110 includes a motherboard 124, which may alternatively be any other suitable type of circuit board. The motherboard 124 may include a socket 126 operable to receive an electronic device, which is an expansion module 128 of a server in this example. As an example, the expansion module 128 may be a DIMM, a riser card, an application-specific integrated circuit (ASIC), or the like. It is noted that alternative to an expansion module, the component may be any other suitable electronic device having one or more electronic elements that need cooling.

The expansion module 128 may include the electronic elements 106 and 108 as well as one or more other electronic elements (not shown for simplicity of illustration). The expansion module 128 may be mechanically and electrically connected to the socket 126 as shown for operable connection to the motherboard 124. When in this operable position, the electronic elements 106 and 108 are in a particular predetermined position with respect to protrusions 102 and 104, respectively, such that airflow is partially or fully directed to the electronic elements 106 and 108, respectively. Protrusions 102 and 104 can generate turbulence from airflow incident on them. Also, the expansion module 128 may be removed and replaced with another expansion module as will be understood by those of skill in the art. It is noted that the computing device 110 may include one or more other sockets for receipt of expansion modules, and these components and other components of the computing device 110 are not shown for simplicity of illustration.

As noted, protrusions 102 and 104 can generate turbulence. This turbulence can be generated in different areas of the interior space 114. Particularly, generated turbulence can be higher in spaces proximate to electronic elements 106 and 108 as compared to other spaces. For example, the airflow deflector protrusion 102 can generate turbulence in the space near a top surface of electronic element 106 when air is directed towards the protrusion 102 in the direction indicated by arrow 138. This space with the generated turbulence can be the space near arrow 104. This turbulence near the top surface of electronic element 106 can be greater than other areas within the interior space 114. For example, a space near arrow 104 can have less turbulence than the turbulence generated near the top surface of electronic element 106. These areas of higher turbulence near electronic elements generated by protrusions 102 and 104 can result in greater cooling of the electronic elements than other areas of less turbulent air.

With continuing reference to FIG. 1, the expansion board 128 is extends from the socket 126 upward along the Y-direction indicated by arrow 130. The expansion module 128 of this example is substantially planar in shape but may alternatively be any other suitable shape and size. Electronic elements 106 and 108 are depicted as being attached to a side of the expansion module 128 and aligned along the Y-direction, but they may alternatively be in other suitable positions.

In this example, protrusions 102 and 104 are positioned along the Y-direction 130 at approximately the same position as electronic elements 106 and 108, respectively. Thus, each protrusion 102 and 104 is positioned away from the motherboard 124 by approximately the same distance as its corresponding electronic element 106 and 108. Along the X-direction 136, each protrusion 102 and 104 is positioned apart from its corresponding electronic element 106 and 108 by a distance for passage of airflow and for re-direction of airflow by the protrusion to its corresponding electronic element.

Protrusions 102 and 104 can be part of an airflow deflector 132. The airflow deflector 132 can include an elongated component 134 that is attached to the circuit board 124 at one end. Component 134 extends upward from the attached end. In this example, the component 134 is substantially planar in shape and substantially parallel with the expansion module 128. The component 134 can be removably attached to the circuit board 124. As shown, the protrusions 102 and 104 are attached to the component 134 at one end and extend in a direction substantially towards the electronic elements 106 and 108, respectively. For example, the protrusions 102 and 104 extend directly to or approximately the direction of the electronic elements 106 and 108, respectively. This direction is indicated by direction arrow X 136. It is noted that in this example there are 2 protrusions and 2 corresponding electronic elements; however, it is noted that there may be any suitable number of electronic elements with any suitable number of protrusions being sized, shaped, and positioned for at least partially directing airflow within the internal space towards the electronic element(s) for cooling the electronic element(s).

The positioning of the electronic elements 106 and 108 within the interior space 114 can be known to an operator. With knowledge of the positioning, the airflow deflector 132 with its protrusions 102 and 104 can be shaped, sized, and positioned for partially or fully directing airflow within the internal space 114 towards electronic elements for cooling. For example, the exact positioning of electronic elements or other electronic elements on an expansion module or other component may be known, such that an appropriate airflow deflector with suitably placed protrusions can be attached adjacent to the expansion module.

As depicted in FIG. 1, some of the airflow within the internal space 114 may move downward towards protrusions 102 and 104 as indicated by arrow 138. Direction arrow 140 shows a direction of deflection of airflow by protrusions 102 towards electronic element 106. This airflow can be a portion or all of the airflow indicated by arrow 138. The airflow indicated by arrow 140 serves to cool the electronic element 106. Similarly for protrusion 104 and electronic element 108, airflow indicated by arrow 142 can be deflected by electronic element 108 in the direction indicated by arrow 144 towards electronic element 108. Residual airflow between the airflow detector 132 and the expansion module 128 is indicated by arrow 146. It is noted that the presently disclosed subject matter should not be limited by this example, because alternatively the airflow may be from any direction and the protrusions may be suitably sized, shaped, and sized for directing the airflow towards electronic elements.

FIG. 2 illustrates a perspective view of the system 100 shown in FIG. 1. Referring to FIG. 2, the edges of the expansion module 128 are shown in broken line but otherwise transparent such that the positioning and shapes of electronic elements 106 and 108 and protrusions 102 and 104 can be viewed more easily.

FIG. 3 illustrates a diagram of another system 300 including airflow deflector protrusions 302, 304, 306, and 308 for cooling electronic elements 310, 312, 314, and 316, respectively, of expansion modules 318 and 320 in accordance with embodiments of the present disclosure. Referring to FIG. 3, the system 300 includes a motherboard 322 with 2 sockets 324 and 326 operably connected thereto. The system 300 also includes an airflow deflector 328 attached to the motherboard 322. The airflow deflector 328 is positioned between the expansion modules 318 and 320. The illustrated components may be situated within a housing (not shown) having airflow.

Protrusions 302 and 304 are positioned on side 328, and protrusions 306 and 308 are positioned on side 330 for deflecting airflow towards electronic elements 310, 312 and 314, 316, respectively. Airflow may move throughout spaces surrounding expansion modules 318 and 320 and airflow deflector 328. Protrusions 302 and 304 may redirect airflow in directions indicated by arrows 332 and 334, respectively, and/or other directions for cooling electronic elements 310 and 312, respectively. Similarly, protrusions 306 and 308 may redirect airflow in directions indicated by arrows 336 and 338, respectively, and/or other directions for cooling electronic elements 306 and 308, respectively.

With continuing reference to FIG. 3, it is shown that protrusions 302, 304, 306, and 308 have different shapes, sizes and positions with respect to the electronic elements. For example, protrusion 302 is substantially triangular in cross-section, and protrusions 304, 306, and 308 are substantially rectangular in cross-section. Also, it is noted that the distance from the motherboard 322 to a protrusion and its respective electronic element (e.g., protrusion 304 and electronic element 312) is approximately the same.

FIG. 4 illustrates a flow diagram of an example method for using airflow deflectors for cooling internally-positioned electronic elements in accordance with embodiments of the present disclosure. This method is described by example with reference to the system 100 shown in FIGS. 1 and 2; however, this should not be considered limiting as the method can be applied to any other suitable system having one or more protrusions and one or more electronic elements in accordance with the present disclosure.

Referring to FIG. 4, the method includes providing 400 a computing device that defines an internal space. For example, the computing device 110 shown in FIG. 1 defines the internal space 114, which contains the motherboard 124, the expansion module 128, and the airflow deflector 132. The internal space 114 may be defined by various components, structures, and coverings of the computing device. For example, the internal space 114 may be defined by an area for housing multiple expansion modules that can be accessed by an operator via an opening. Air may circulate within the internal space 114 by use of the fan 118, another fan, or other ways as will be understood by those of skill in the art.

The method includes positioning 402 an airflow deflector with protrusions within the internal space. The protrusion may extend towards a location for an electronic element of an electronic device. Continuing the aforementioned example, the airflow deflector 132 may be attached to the motherboard 124 in a predetermined position by an operator or manufactured with the airflow 132 in this position. The airflow deflector 132 may be attached for placement in this position based on knowledge of the placement of electronic elements 106 and 108. It may be known by the operator or manufacturer that the installed expansion module 128 may have its electronic elements 106 and 108 in the shown positions such that they can receive the deflected airflow indicated by arrows 140 and 144 for their cooling. For example, the operator and manufacturer may know that the expansion module 128 has its electronic elements 106 and 108 in these positions. The placement and or type of the airflow deflector may be selected for this purpose. As an example, an operator or manufacturer may know that a DIMM of a particular type or model that is planned for installation has its electronic elements, such as heat-generating memory components, in these positions.

The method includes attaching 404 the electronic device to the computing device such that the electronic element is positioned for receiving airflow within the internal space that is directed towards the electronic element by the protrusion. Continuing the aforementioned example, the expansion module 128 can initially be outside of the computing device 110 and subsequently inserted into its socket 126 for operability with the computing device 110. At this inserted and operable position, electronic elements 106 and 108 are located for receiving airflow (indicated by arrows 140 and 144, respectively) directed by protrusions 140 and 144, respectively.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A system comprising:
    an electronic device including an electronic element that generates heat during operation, wherein the electronic element is positioned within an internal space of the electronic device, the electronic element attached to a circuit board of the electronic device; and
    an airflow deflector attached to the circuit board and positioned within the internal space adjacent to the electronic element and with a portion of the internal space open for airflow between the electronic element and the airflow deflector,
    wherein the airflow deflector comprises a protrusion that extends in a direction substantially towards the electronic element, wherein the protrusion is positioned and shaped for at least partially directing airflow within the internal space towards the electronic element for cooling the electronic element, and wherein the protrusion and the electronic element are positioned away from the circuit board at approximately the same distance.

2. The system of claim 1, wherein the electronic device comprises one of a server or desktop computer.

3. The system of claim 1, wherein the electronic device comprises an expansion module of a computing device.

4. The system of claim 1, wherein the electronic elements comprises one of memory, an integrated circuit, or riser card.

5. The system of claim 1, wherein the protrusion is a first protrusion, and wherein the electronic element is a first electronic element, wherein the electronic device includes a second electronic element, wherein the airflow deflector comprises a second protrusion that extends in a direction substantially towards the second electronic element, and wherein the second protrusion is positioned and shaped for at least partially directing airflow within the internal space towards the second electronic element for cooling the second electronic element.

6. The system of claim 5, wherein the airflow deflector defines a first side and a second side, wherein the first side opposes the second side, wherein the first protrusion and the second protrusion are positioned on the first side and the second side, respectively.

7. The system of claim 6, wherein the airflow deflector comprises an elongated component attached to a structure of the electronic device.

8. The system of claim 7, wherein the elongated component is attached at one end to a circuit board.

9. The system of claim 5, wherein the airflow deflector defines a side, and wherein the first protrusion and the second protrusion are positioned on the side.

10. The system of claim 1, wherein the internal space comprises a first space and a second space, wherein the first space is in proximity to the electronic element, and wherein the second space is farther from the electronic element than the first space, and wherein the airflow deflector is positioned such that turbulence of the airflow is generated in the first space, and such that the airflow at the second space has less turbulence than the turbulence generated in the first space.

11. A method comprising:

providing a computing device that defines an internal space;

positioning an airflow deflector within the internal space of the computing device, wherein the airflow deflector comprises a protrusion that extends in a direction substantially towards a location for an electronic element of an electronic device, wherein the airflow deflector and the electronic device are attached to a circuit board, and wherein the electronic element and the protrusion are positioned adjacent to each other with a portion of the internal space for airflow therebetween; and attaching the electronic device to the computing device such that the electronic element is positioned for receiving airflow within the internal space that is directed towards the electronic element by the protrusion, wherein the electronic element and the protrusion are positioned away from the circuit board by approximately the same distance.

12. The method of claim 11, wherein the protrusion is a first protrusion, and wherein the electronic element is a first electronic element, wherein the electronic device includes a second electronic element, wherein the airflow deflector comprises a second protrusion that extends in a direction substantially towards the second electronic element, and wherein the second protrusion is positioned and shaped for at least partially directing airflow within the internal space towards the second electronic element for cooling the second electronic element.

13. The method of claim 11, wherein the airflow deflector defines a first side and a second side, wherein the first side opposes the second side, wherein the first protrusion and the second protrusion and positioned on the first side and the second side, respectively.

14. The method of claim 13, wherein the airflow deflector comprises an elongated component attached to a structure of the electronic device.

15. The method of claim 14, wherein the elongated component is attached at one end to a circuit board.

16. The method of claim 11, wherein the airflow deflector defines a side, and wherein the first protrusion and the second protrusion are positioned on the side.

* * * * *